United States Patent [19]

Monnier

[11] 4,200,842
[45] Apr. 29, 1980

[54] SWITCHABLE DIVIDER

[75] Inventor: Dan E. Monnier, Skokie, Ill.

[73] Assignee: Norlin Industries, Inc., Lincolnwood, Ill.

[21] Appl. No.: 895,743

[22] Filed: Apr. 13, 1978

[51] Int. Cl.² .................................... H03K 21/36
[52] U.S. Cl. ................................ 328/42; 328/48; 328/49
[58] Field of Search .............. 328/39, 41, 42, 48, 328/49

[56] References Cited

U.S. PATENT DOCUMENTS

| | | | |
|---|---|---|---|
| 3,393,366 | 7/1968 | Shoop | 328/48 |
| 3,800,233 | 3/1974 | Sauthier | 328/42 X |
| 3,967,205 | 6/1976 | Rossi et al. | 328/48 X |
| 4,092,604 | 5/1978 | Berney | 328/48 |

Primary Examiner—John S. Heyman
Attorney, Agent, or Firm—Ronald J. Kransdorf; Jack Kail

[57] ABSTRACT

A frequency divider circuit is selectively operable for providing an output signal characterized by a first frequency or a second frequency equal to one-half the first frequency. An input signal at the first frequency is supplied to the clock terminal of a D-type flip-flop and a stream of control pulses, developed in synchronism with the input signal, are selectively coupled by a logic circuit to the set terminal of the flip-flop. The D and $\overline{Q}$ terminals of the flip-flop are coupled together forming an output for providing a signal at the first frequency in response to the presence of the control pulses and at the second frequency in response to the absence of the control pulses.

8 Claims, 7 Drawing Figures

SWITCHABLE DIVIDER

BACKGROUND OF THE INVENTION

This invention generally relates to frequency divider circuits and, more particularly, to a frequency divider circuit selectively operable for providing a frequency divided representation of an input signal or, alternatively, an undivided representation of the input signal.

In various applications it is desirable to provide a frequency divider circuit whose operation can be selectively controlled for providing an output signal characterized by different frequencies. For example, in an electronic organ or the like, a rhythm unit may be operated in response to input clock signals for producing sound characteristics simulating a particular rhythm. The frequency composition of the rhythm may therefore be conveniently modified by suitably changing the pulse repetition rate or frequency of the input clock signal according to a preselected sequence. In a known application of the foregoing type it is particularly useful to provide means for selectively producing an output signal having a particular frequency or a frequency equal to one-half thereof.

A known circuit operable for providing an output signal alternatively characterized by a frequency f or f/2 consists of a source of input clock pulses coupled by a divide by two circuit to one input of a first AND gate of an AND-OR select circuit. The clock pulses are also directly coupled to a first input of a second AND gate of the AND-OR select circuit, both AND gates having outputs supplying an OR gate. A control signal is coupled directly to a second input of the second AND gate and through an inverter to a second input of the first AND gate. Thus, when the control signal is logically low, the first AND gate is enabled and an output is developed by the OR gate at a frequency equal to the frequency f of the clock pulses. On the other hand, when the control signal is logically high, the second AND gate is enabled and a signal is developed at the output of the OR gate having a frequency of f/2. Thus, by suitably establishing a logically low or logically high control signal an output signal is developed having a frequency of either f or f/2, where f is the frequency of the input clock signal.

In a system of the foregoing type, the control signal is typically asynchronously related to the input clock signal. As a result, depending upon the phase relationship between the input clock signal and the control signal, unwanted signal components, generally narrow spikes, are intermingled with the otherwise desired components of the output signal. These unwanted signal spikes frequently prove troublesome to the apparatus controlled by the output signal rendering its operation erratic.

A known method of eliminating these signal spikes is to provide ancillary circuitry for synchronizing the control signal with the input clock pulses. Needless to say, this technique involves added complexity in circuit design along with additional cost to implement a suitable system.

SUMMARY OF THE INVENTION

In accordance with the foregoing, it is therefore a primary object of the present invention to provide a switchable frequency divider capable of producing a variable frequency output signal having no undesired signal components.

It is a further object of the present invention to provide a frequency divider of the foregoing type which exhibits a relatively simple design requiring no ancillary signal synchronization apparatus.

In accordance with these and other useful objects, there is provided a switchable frequency divider comprising an input signal source generating a succession of clock pulses for application to the clock terminal of a bi-stable device. The bi-stable device is responsive to the 0-1 logical transitions of the clock signal for producing a divided by two representation thereof. A control signal source, selectively operable for providing a logically high or low output, is coupled to one input of a NOR gate, the output of which is coupled to the set terminal of the bi-stable device. A second input of the NOR gate is supplied with a succession of signal spikes derived from the clock pulses and corresponding to the logical 1-0 transitions of the clock pulses.

In order to achieve a divided by two representation of the clock pulses at the output of the bi-stable device the control signal source is operated for generating a logically high output thereby inhibiting the NOR gate which, in turn, maintains the set terminal of the bi-stable device at a logically low level. Under these conditions, the bi-stable device is responsive only to clock pulses for producing a divided representation thereof. The NOR gate is enabled upon operation of the control signal source for generating a logically low level output. In this case, a succession of relatively narrow control pulses corresponding to the logical 1-0 transitions of the clock pulses are coupled to the set terminal of the bi-stable device resulting in the production of an undivided representation of the clock pulses.

DESCRIPTION OF THE PREFERRED EMBODIMENT

Figure 1:
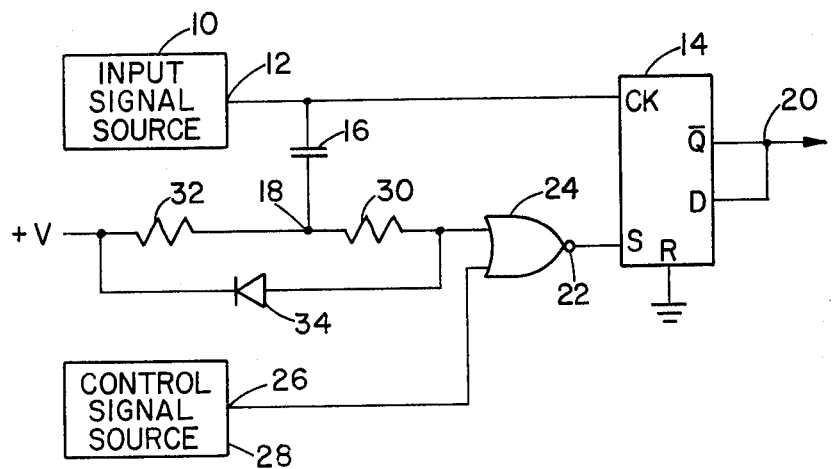
FIG. 1 is a schematic diagram, partially in block form, of the preferred embodiment of the frequency divider of the present invention.

Referring now to the drawings and, in particular, to FIG. 1, the switchable frequency divider of the present invention comprises an input signal source 10 having an output 12 on which is developed a succession of clock pulses. The clock pulses developed at output 12 are applied to the clock terminal of a D-type flip-flop 14 and through a capacitor 16 to a node 18. The Q and D terminals of flip-flop 14 are coupled together forming an output node 20. The reset terminal of flip-flop 14 is connected to ground potential while its set terminal is supplied by the output 22 of a NOR gate 24.

NOR gate 24 includes a first input supplied from the output 26 of a control signal source 28 and a second input coupled to node 18 by a resistor 30. Node 18 is in turn coupled to a source of potential +V through a resistor 32, a diode 34 being connected across the series combination of resistors 30 and 32.

Figure 2:
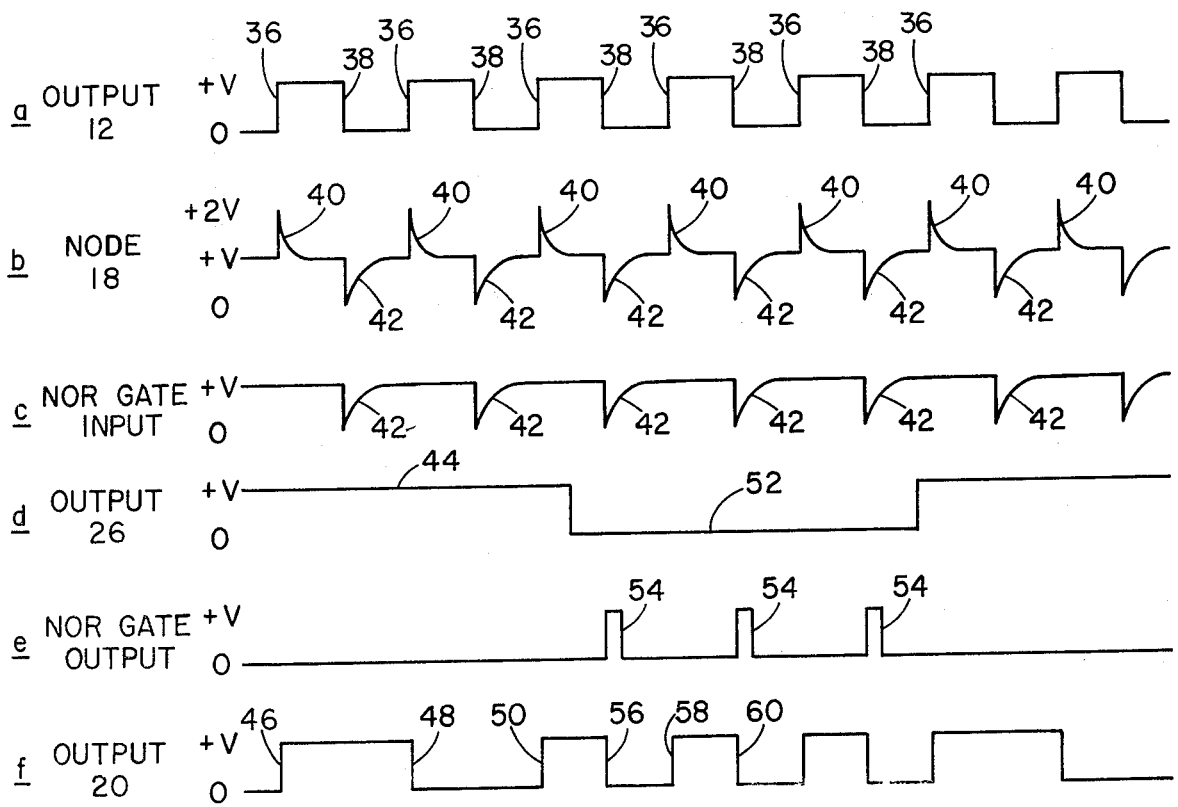
FIGS. 2a-2f are illustrative wave forms of signals generated at different points of the frequency divider shown in FIG. 1.

The clock pulses developed at output 12 of input signal source 10 are illustrated in FIG. 2a. It will be understood that the clock pulses are characterized by a pulse repetition rate or frequency f defining a plurality of logical 0-1 transitions 36 and a corresponding plurality of logical 1-0 transitions 38. Flip-flop 14 is connected for responding to each logical 0-1 transition 36 of the clock pulses by changing state and thereby effecting a logical transition in the output signal developed at node 20. That is, flip-flop 14 inherently assumes the state of the signal appearing at its D terminal in response to each logical 0-1 transition 36 applied to its clock terminal. Since the D and $\bar{Q}$ terminals of the flip-flop are coupled together and, assuming that the flip-flop is in a logical 1 state ($\bar{Q}=0$), the next occurring logical 0-1 transition 36 will cause the flip-flop to assume a logical 0 state. Similarly, assuming that the flip-flop is in a logical 0 state ($\bar{Q}=1$), the next occurring logical 0-1 transition 36 will cause the flip-flop to assume a logical 1 state. Thus, a state change in flip-flop 14 results in response to each logical 0-1 transition 36 of the clock pulses.

In addition, each logical 0-1 transition 36 of the clock pulses results in the production of a positive going spike 40 at node 18. This is, immediately preceding the occurrence of a logical 0-1 transition 36 the plate of capacitor 16 connected to node 18 is at +V potential while its other plate, ie. the plate connected to output 12 of input signal source 10, is at 0 potential. Substantially concurrently with a logical 0-1 transition 36 the plate of capacitor 16 connected to output 12 rises to a potential of +V causing the potential at node 18 to increase to +2 V. Capacitor 16 subsequently discharges through resistors 30 and 32 returning the potential at node 18 to +V. The RC time constant characterizing the circuit consisting of capacitor 16 and the parallel combination of resistors 30 and 32 is selected so as to insure the complete decay of signal spikes 40 prior to the occurrence of the next occurring logical 1-0 transition 38. Thus, immediately preceding each logical 1-0 transition of the clock pulses, the potential at both plates of capacitor 16 is +V.

Now, each logical 1-0 transition 38 results in the production of a negative going spike 42 at node 18. Recalling that the potential at both plates of capacitor 16 immediately preceding a logical 1-0 transition 38 is +V, the potential at node 18 is caused to decrease to 0 volts in response to the potential at the plate of capacitor 16 connected to output 12 being pulled to a potential of 0 volts substantially concurrently with a logical 1-0 transition 38. Subsequently, capacitor 16 exponentially charges through resistor 32 returning the potential at node 18 to +V. The time constant of the circuit consisting of capacitor 16 and resistor 32 is selected to insure that the potential at node 18 returns to a +V substantially prior to the next succeeding logical 0-1 transition 36. The foregoing action is continuously repeated in response to logical transitions 36 and 38 of the clock pulses developed at output 12 whereby an alternating series of positive and negative going spikes 40 and 42 is produced at node 18.

The potential developed at node 18, and illustrated in FIG. 2b, is applied to an input of NOR gate 24 through resistor 30. However, due to the rectifying action of diode 34, only the negative going spikes 42 are developed at the NOR gate input. This signal is illustrated in FIG. 2c and will be seen to consist of a plurality of negative going spikes substantially coinciding with the logical 1-0 transitions 38 of the clock pulses.

The other input of NOR gate 24 is supplied with a control signal developed at output 26 of control signal source 28. The control signal comprises a selected sequence of logically low and high level signals, a particular example of which is illustrated in FIG. 2d. As will be explained in further detail hereinafter, flip-flop 14 produces an undivided representation of the clock pulses at output node 20 in response to a logically low level control signal and a divided representation, ie. divided by two, of the clock pulses in response to a logically high level control signal.

Initially, it will be appreciated that a high level control signal will inhibit NOR gate 24 while a low level control signal will enable the gate. Therefore, referring to the control signal illustrated in FIG. 2d, during the initial high level segment 44 of the control signal, NOR gate 24 is inhibited and couples a low level signal to the set terminal of flip-flop 14. Under these circumstances, flip-flop 14 changes state only in response to each 0-1 transition 36 of the clock pulses producing logical transitions 46, 48 and 50 at output node 20 corresponding to an output signal constituting a divided by two representation of the clock pulses. During the succeeding logically low level segment 52 of the control signal, NOR gate 24 is enabled and produces a series of relatively narrow control pulses 54 at its output 22 in response to negative going spikes 42. The initial one of the illustrated control pulses 54 sets flip-flop 14 producing a logical 1-0 transition 56 at output node 20. Output node 20 next experiences a logical 0-1 transition 58 in response to a logical 0-1 transition 36 of the clock pulses applied to the clock terminal of flip-flop 14. The second control pulse 54 again sets the flip-flop producing a logical 1-0 transition 60 at output node 20. The foregoing process continues as long as the control signal remains low thereby resulting in the production at output node 20 of an undivided representation of the clock pulses.

It will be appreciated by those skilled in the art that the switchable frequency divider described above can also be operated by connecting the flip-flop's D and $\bar{Q}$ terminals as shown and deriving the output signal from its Q terminal. This would, however, result in the production of an output signal out of phase with the clock pulses, an effect not desired in certain applications. An additional possible modification to the circuit illustrated in FIG. 1 includes the connection of output 22 of NOR gate 24 to the reset terminal R of flip-flop 14 in which case the output developed at node 20 would be slightly shifted in time with respect to that shown in FIG. 2f. Also, with suitable modifications, alternative logic formulations of gate 24 could be employed.

While particular embodiments of the invention have been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

I claim:
1. A frequency divider circuit comprising:
means for generating a succession of clock pulses having a frequency f and characterized by logical transitions having first and second polarities;
control means selectively operable for producing a control signal having first and second logical levels;
bi-stable means characterized by first and second logical states and responsive to said first polarity logical transitions of said clock pulses for changing logical states; and logic means responsive to one of said logical levels of said control signal and to said clock pulses for causing said bi-stable means to assume a predetermined one of said logical states in response to said second polarity logical transitions.

2. The circuit according to claim 1 wherein said logic means comprises means for generating a succession of control pulses in response to said one of said logical levels of said control signal and said second polarity logical transitions, said bi-stable means providing an output signal comprising a frequency divided representation of said clock pulses in response to the absence of said control pulses and an undivided representation of said clock pulses in response to the presence of said control pulses.

3. The circuit according to claim 2 wherein said bi-stable means comprises a D-type flip-flop, the D and $\overline{Q}$ terminals of said flip-flop being connected together for developing said output signal, said output signal having a frequency f/2 in response to the absence of said control pulses and having a frequency f in response to the presence of said control pulses.

4. The circuit according to claim 2 wherein said logic means comprises means for developing a succession of signal spikes in response to said second polarity logical transitions of said clock pulses and a logic gate for generating said control pulses in response to coincidence of said signal spikes and said one of said logical levels of said control signal.

5. The circuit according to claim 4 wherein said means for developing said signal spikes comprises a pair of series connected resistors forming a node therebetween, a capacitor connected for coupling said clock pulses to said node and a source of potential coupled to one end of said series connected resistors, to the other end of said series connected resistors developing said signal spikes.

6. The circuit according to claim 5 including a diode connected in parallel across said pair of resistors.

7. The circuit according to claim 6 wherein said source of potential and said one of said logical levels of said control signal are characterized by logically high and logically low levels respectively and wherein said logic gate comprises a NOR gate.

8. The circuit according to claim 7 wherein said first polarity logical transitions of said clock pulses comprise 0-1 logical transitions and said second polarity logical transitions comprise 1-0 transitions.

* * * * *